(12) United States Patent
Yahagi et al.

(10) Patent No.: US 7,484,546 B2
(45) Date of Patent: Feb. 3, 2009

(54) SPUTTERING TARGET FOR PHASE-CHANGE MEMORY, FILM FOR PHASE CHANGE MEMORY FORMED BY USING THE TARGET, AND METHOD FOR PRODUCING THE TARGET

(75) Inventors: Masataka Yahagi, Ibaraki (JP); Yuichiro Shindo, Ibaraki (JP); Hideo Takami, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 274 days.

(21) Appl. No.: 11/533,945

(22) Filed: Sep. 21, 2006

(65) Prior Publication Data

US 2007/0062808 A1    Mar. 22, 2007

Related U.S. Application Data

(62) Division of application No. 10/504,739, filed as application No. PCT/JP02/12739 on Dec. 5, 2002, now Pat. No. 7,156,964.

(30) Foreign Application Priority Data

Feb. 25, 2002    (JP) ............................. 2002-047370

(51) Int. Cl.
*B22D 7/00*    (2006.01)
*B22D 27/00*    (2006.01)

(52) U.S. Cl. ...................... 164/55.1; 164/76.1
(58) Field of Classification Search ................. 164/133, 164/337, 55.1
See application file for complete search history.

(56) References Cited

U.S. PATENT DOCUMENTS 4,842,706 A * 6/1989 Fukasawa et al. ...... 204/298.13

2007/0297938 A1    12/2007   Takahashi

FOREIGN PATENT DOCUMENTS

| JP | 62-114137 | A | 5/1987 |
| JP | 63-100632 | A | 5/1988 |
| JP | 3-162570 | * | 7/1991 |
| JP | 03-162570 | A | 7/1991 |
| JP | 5-47053 | * | 2/1993 |
| JP | 05-047053 | A | 2/1993 |
| JP | 5-155625 | * | 6/1993 |

OTHER PUBLICATIONS

Unpublished Co-pending U.S. Appl. No. 11/722,218 (cited for consideration of Double Patenting Issues).
Unpublished Co-pending U.S. Appl. No. 11/813,694 (cited for consideration of Double Patenting Issues).

* cited by examiner

*Primary Examiner*—Kuang Lin
(74) *Attorney, Agent, or Firm*—Howson & Howson LLP

(57) ABSTRACT

The present invention provides a sputtering target for a phase change memory and a phase change memory film formed with such a target, and the manufacturing method thereof, characterized in that the sputtering target is composed from elements of not less than a three component system and has as its principal component one or more components selected from stibium, tellurium and selenium, and the compositional deviation in relation to the intended composition is ±1.0 at % or less. This sputtering target for a phase change memory is capable of reducing, as much as possible, impurities that cause the reduction in the number of times rewriting can be conducted as a result of such impurities segregating and condensing in the vicinity of the boundary face of the memory point and non-memory point; in particular, impurity elements that affect the crystallization speed, reducing the compositional deviation of the target in relation to the intended composition, and improving the rewriting properties and crystallization speed of a phase change memory by suppressing the compositional segregation of the target.

17 Claims, No Drawings

SPUTTERING TARGET FOR PHASE-CHANGE MEMORY, FILM FOR PHASE CHANGE MEMORY FORMED BY USING THE TARGET, AND METHOD FOR PRODUCING THE TARGET

CROSS REFERENCE TO RELATED APPLICATIONS

This application is a divisional of U.S. application Ser. No. 10/504,739, now U.S. Pat. No. 7,156,964, which is the National Stage of International Application No. PCT/JP02/12739, filed Dec. 5, 2002, which claims the benefit under 35 USC 119 of Japanese Application No. 2002-047370, filed Feb. 25, 2002.

BACKGROUND OF THE INVENTION

The present invention pertains to a sputtering target for a phase change memory capable of reducing, as much as possible, impurity elements that affect the crystallization speed, reducing the compositional deviation of the target in relation to the intended composition, and improving the rewriting characteristics and crystallization speed of the phase change memory by suppressing the compositional segregation of the target, as well as to a phase change memory film formed with such a target and the manufacturing method of this target.

In recent years, high-density memory optical disc technology capable of storage/reproduction without requiring a magnetic head has been developed, and is rapidly attracting attention. This optical disc can be classified into the three categories of reproduction-only, recordable and rewritable. Particularly, the phase change method employed in the recordable and rewritable type discs is attracting attention.

This phase change optical disc performs the storage/reproduction of information by heating and increasing the temperature of a memory thin film on a substrate by irradiating a laser beam thereto, and generating a crystallographic phase change (amorphous⇔crystal) in the structure of such memory thin film. More specifically, the reproduction of information is conducted by detecting the change in the reflectivity caused by the change in the optical constant of the phase.

The aforementioned phase change is performed with the irradiation of a laser beam narrowed down to a diameter of approximately 1 to several μm. Here, for example, when a 1 μm laser beam passes through at a linear velocity of 10 m/s, light is irradiated to a certain point on the optical disc for 100 ns, and it is necessary to perform the aforementioned phase change and detect the reflectivity within such time frame, and realize the foregoing crystallographic phase change; that is, the phase change of the amorphous and crystal.

In light of the above, a phase change optical disc has a four-layer structure wherein, for instance, both sides of a Ge—Sb—Te or In—Sb—Te memory thin film layer or the like are sandwiched with a zinc sulfide-silicic oxide (ZnS—$SiO_2$) high-melting point dielectric or the like, and an aluminum alloy reflective layer is additionally provided thereto. Stibium (Sb), tellurium (Te) or selenium (Se) is an important constituent element as the foregoing optical memory medium.

Moreover, recently, a nonvolatile phase change memory has been proposed which forms a chalcogenide film with sputtering, makes an electrode contact such film, and generates a phase change of the chalcogenide by flowing current to this electrode, and this technology is attracting attention. The nonvolatile memory employing this type of technique is generally referred to as a PRAM or OUM (Ovonic Unified Memory).

To explain the outline of this OUM, when a chalcogenide sputtering thin film is partially heated to 600° C. or higher, an amorphous phase is formed upon quick cooling of 1 to 2 ns. Here, the heated area is narrow, and, although the center will reach 600° C. with a device measurement of 50×200 $nm^2$, there is data stating that at 100 nm away, the temperature only rises to 100° C.

Although crystallization will not occur with the quick cooling described above, crystallization will occur when this is annealed for 20 ns to 50 ns at 300 to 400° C. Crystallized chalcogenide has low resistance, but amorphous has high resistance. And, in either state, the characteristics will be inverted when exceeding the threshold voltage.

OUM utilizes the foregoing characteristics, and has numerous advantages such as nonvolatility, high density, low voltage, low power consumption, rewriting is possible $10^{12}$ times, nondestructive readout, integration with the Si process is easy, it may be made into a unified memory, and so on.

A phase change optical disc and OUM both employ a chalcogenide sputtering thin film formed from the element of stibium, tellurium or selenium, and sufficient consideration must be given to the characteristics of the material.

Nevertheless, when impurities get mixed into this type of memory medium, such impurities would get condensed near the boundary face of the memory point and non-memory point together with the repetition of the phase change between the liquid phase-solid phase in connection with the deletion of memory, and a crystal growth nucleus that will become the source of coarse crystal grains in the vicinity of the memory point will arise, whereby the number of times rewriting may be conducted is reduced as a result thereof.

The memory thin film layer, which is this type of phase change memory medium, is usually formed with the sputtering method as described above. This sputtering method makes a positive electrode target and a negative electrode target face each other, and generates an electric field by applying a high voltage between the substrates thereof and the targets under an inert gas atmosphere. The sputtering method employs a fundamental principle where plasma is formed pursuant to the collision of electrons, which are ionized at such time, and the inert gas, the positive ion in this plasma extrudes the atoms structuring the target by colliding with the target (negative electrode) surface, and the extruded atoms adhere to the opposing substrate surface, wherein the film is formed thereby.

The target used for sputtering in itself contains numerous impurities, and, when the deviation in relation to the intended composition is significant, this will considerably affect the memory thin film layer, and there is a problem in that the number of times rewriting can be conducted will decrease as a result thereof.

In light of the above, several high purity and high density targets have been proposed. This type of manufacturing method conventionally proposed is a manufacturing method combining the dissolution method and powder metallurgical production. Nevertheless, the elements of stibium, tellurium and selenium have high vapor pressure, and, since these elements preferentially evaporate during dissolution, they tend to deviate from the intended composition, and there were additional drawbacks in that segregation of the composition would occur in the target. Compositional deviation in the recording film causes the unevenness in the crystallization speed, and also adversely affects the rewriting characteristics.

In consideration of the above, the compositional deviation was either neglected, or the composition was prepared in anticipation of such compositional deviation or compositional segregation. With respect to the latter, although there are cases that the intended composition is fortunately obtained, the precision of compositional evenness and reproducibility of deposition are inferior, and there is a drawback in that the product will be unstable.

Further, since the foregoing methods connive at the evaporation in the heating furnace, there is a problem in that the inside of the furnace gets contaminated for each process, and, while dissolution is being repeated, contamination arises from gas components, inside of the furnace and from crucible materials, and there is a problem in that it is difficult to maintain the target at a high purity.

SUMMARY OF THE INVENTION

An object of the present invention is to provide a sputtering target for a phase change memory capable of reducing, as much as possible, impurities that cause the reduction in the number of times rewriting can be conducted as a result of such impurities segregating and condensing in the vicinity of the boundary face of the memory point and non-memory point; in particular, impurity elements that affect the crystallization speed, reducing the compositional deviation of the target in relation to the intended composition, and improving the rewriting properties and crystallization speed of the phase change memory by suppressing the compositional segregation of the target.

In order to achieve the foregoing object, as a result of intense study, the present inventors discovered that a sputtering target could be manufactured reliably and stably.

Based on the foregoing discovery, the present invention provides:

1. A sputtering target for a phase change memory and a phase change memory film formed with the target, characterized in that the sputtering target is composed from elements of not less than a three component system and has as its principal component one or more components selected from stibium, tellurium and selenium, and the compositional deviation in relation to the intended composition is ±1.0 at % or less;

2. A sputtering target for a phase change memory and a phase change memory film formed with the target, characterized in that the sputtering target is composed from elements of not less than a three component system and has as its principal component one or more components selected from stibium, tellurium and selenium, and, when the average value of composition $A_i$ (wt %) of the respective constituent elements excluding the main components in each of the two or more samples ($i=2, 3, 4 \ldots$) collected from an arbitrary location within the target is $A$(wt %), $|A-A_i| \leq 0.15$;

3. A sputtering target for a phase change memory and a phase change memory film formed with the target according to paragraph 1 above, characterized in that the sputtering target is composed from elements of not less than a three component system and has as its principal component one or more components selected from stibium, tellurium and selenium, and, when the average value of composition $A_i$ (wt %) of the respective constituent elements excluding the main components in each of the two or more samples ($i=2, 3, 4 \ldots$) collected from an arbitrary location within the target is $A$(wt %), $|A-A_i| \leq 0.15$;

4. A sputtering target for a phase change memory and a phase change memory film formed with the target according to anyone of paragraphs 1 to 3 above, characterized in that the purity excluding gas components is 99.995 wt % or more, and the total amount of carbon, nitrogen, oxygen and sulfur, which are gas components, is 700 ppm or less;

5. A sputtering target for a phase change memory and a phase change memory film formed with the target according to anyone of paragraphs 1 to 4 above, characterized in that the average crystal grain size of the target is 50 μm or less, and the relative density is 90% or more; and 6. A sputtering target for a phase change memory and a phase change memory film formed with the target according to anyone of paragraphs 1 to 5 above, characterized in that the sputtering target further contains one or more types selected from transition metal, gallium, germanium, indium and tin as an auxiliary component.

The present invention further provides:

7. A manufacturing method of a sputtering target for a phase change memory according to anyone of paragraphs 1 to 6 above, characterized in that dissolution and casting are performed in a vacuum or under a hermetically sealed inert gas atmosphere;

8. A manufacturing method of a sputtering target for a phase change memory according to paragraph 7 above, characterized in that a quartz container in which the inside thereof is a vacuum or inert gas atmosphere is used, and dissolution and casting are performed upon hermetically sealing the container;

9. A manufacturing method of a sputtering target for a phase change memory according to paragraph 8 above, characterized in that high purity quartz in which the alkali component is 10 ppm or less and OH is 5 ppm or less is used;

10. A manufacturing method of a sputtering target for a phase change memory according to anyone of paragraphs 7 to 9 above, characterized in that the purity of the raw material before dissolution is 99.999 wt % or higher; and 11. A manufacturing method of a sputtering target for a phase change memory according to anyone of paragraphs 7 to 10 above, characterized in that dissolution and casting are performed at a temperature higher than the melting point of the constituent element or generated compound.

DETAILED DESCRIPTION OF THE INVENTION

Conventionally, target materials for an optical disc memory layer were sufficiently tolerable for use even with purity levels of 3N5 to 4N. Nevertheless, with the high speed memories and minute spots realized with short wavelength lasers in recent years, more sophisticated targets are in demand.

Impurities within the target segregate and condense in the vicinity of the boundary face of the memory point and non-memory point, and cause reduction in the number of times rewriting can be conducted. Further, when there are numerous impurities, such impurities hinder the counter diffusion of atoms upon making the amorphous state, in which the respective constituent elements are distributed considerably evenly, to a crystallized state and much time is required as a result thereof, and there is a problem in that the crystallization speed becomes slow.

In light of the above, recently, with alloy targets formed mainly of stibium, tellurium or selenium used as recording materials employing a crystal phase change, it is necessary to reduce as much as possible compositional deviation of the intended target and compositional segregation within the target, and to realize high purity levels pursuant to the miniaturization of the recording portion aiming to increase the number of times rewriting can be conducted, enable recordings at faster speeds, and increase the capacity of memory.

From the perspective of impurities, alkali metals and alkali earth metals that diffuse and move significantly are a problem. Moreover, also from the perspective of corrosion resistance, reduction of these elements is important, and high corrosive resistance can be maintained in relation to the environment. In addition, impurities such as U and Th, which are radioactive elements, cause malfunctions when using the phase change memory, and it is desirable that these elements also be reduced.

Moreover, deviation from the intended composition of the phase change memory film composition will affect the rewriting characteristics and crystallization speed, and in particular will significantly influence the crystallization speed. Thus, it is necessary to reduce the compositional deviation of principal components and auxiliary components. Compositional deviation of the target will lead directly to the deviation in the film composition, and the control of such target composition is extremely important.

The present invention is a sputtering target for a phase change memory, and this sputtering target is composed from elements of not less than a three component system and has as its principal component one or more components selected from stibium, tellurium and selenium, and the compositional deviation in relation to the intended composition is ±1.0 at % or less.

Moreover, the present invention is also a sputtering target for a phase change memory, and, with this sputtering target, when the average value of composition $Ai$(wt %) of the respective constituent elements excluding the main components in each of the two or more samples (i=2, 3, 4 . . . ) collected from an arbitrary location within the target is $A$(wt %), $|A-Ai| \leqq 0.15$.

The sputtering target for a phase change memory of the present invention contains one or more types selected from transition metal, gallium, germanium, indium and tin as an auxiliary component.

According to the above, the phase change memory film formed with this target is able to reduce the compositional deviation and compositional segregation of the target, and, as a result, the precision of the intended composition will increase, reproducibility will improve, and rewriting characteristics and crystallization speed can be significantly improved.

Purity of the target excluding gas components is 99.995 wt % or more, and the total amount of carbon, nitrogen, oxygen and sulfur, which are gas components, is 700 ppm or less. Gas components contained in the target have an adverse effect on the generation of particles during sputtering, and, by being absorbed in the film, will adversely affect the rewriting characteristics, crystallization temperature and crystallization speed. The present invention is able to overcome these problems.

In order to perform even deposition, it is desirable that the target composition be minute and precise as possible, and, in the present invention, the average crystal grain size of the target is 50 μm or less, and the relative density is 90% or more.

Next, the manufacturing method of the high purity sputtering target of the present invention will be explained. Conventionally, stibium, tellurium and selenium are extremely brittle, and, when these are acid cleansed, the acid remains therein and becomes a factor in increased oxygen or the like in subsequent procedures, and acid cleansing was not performed due to the foregoing reasons.

Meanwhile, with stibium, tellurium and selenium, impurities are easily segregated in the grain boundary, and it has become known that there is a phenomenon of ingots and the like cracking from the grain boundary. This implies that impurities were condensed in such cracked portions.

In light of the above, the foregoing condensed impurities can be effectively eliminated by suitably crushing the raw material of stibium, tellurium or selenium, adjusting the grain size by placing such raw material through a sieve, and thereafter cleansing this with acid.

Next, after eliminating the impurities with acid cleansing as described above, the raw materials are dissolved and cast to obtain a high purity stibium, tellurium or selenium ingot.

Slag floating on the surface during dissolution is eliminated. When there is no slag, this process may be omitted.

It is desirable that the raw material of stibium, tellurium or selenium placed through a sieve be adjusted to a grain size of 0.5 mm to 10 mm. If the grain size is less than 0.5 mm, cleansing becomes difficult, and the cleansing efficiency will not increase. Contrarily, if the grain size exceeds 10 mm, impurities remain in the raw material powder, and there is a problem in that sufficient cleansing cannot be conducted. Therefore, the raw material of stibium, tellurium or selenium is adjusted to a grain size of 0.5 mm to 10 mm, and more preferably to a range of 1 mm to 5 mm.

As the cleansing acid, one type among hydrochloric acid, nitric acid, sulfuric acid, and hydrofluoric acid, or two or more types of mixed acids thereof may be used. Hydrochloric acid is in particular effective as the cleansing acid. The acid concentration is 0.5N to 6N. If the acid concentration is less than 0.5N, too much time will be required for the acid cleansing, and when the acid concentration exceeds 6N, stibium, tellurium or selenium will be partially dissolved, which is a loss. Thus, it is desirable that the acid concentration is 0.5N to 6N.

Further, acid cleansing is performed at a temperature of 10° C. to 80° C. If the temperature is less than 10° C., the elimination of impurities will not be conducted effectively, and if the temperature exceeds 80° C., the liquid will evaporate significantly, and this will lead to a significant loss of acid, which is not preferable.

As the raw material, stibium, tellurium or selenium having a purity level of 2N to 3N (99 wt % to 99.9 wt %) or more is used. With the operation of the present invention as described above, the purity level after high purification will be 4N to 5N or more.

After acid cleansing, the raw material powder of stibium, tellurium or selenium is cleansed with purified water, dried, thereafter dissolved and cast under an inert gas atmosphere such as argon gas, or in a vacuum, to obtain a high purity stibium, tellurium or selenium ingot.

As described above, with the simple methods of acid cleansing and dissolution, stibium, tellurium or selenium having a purity level of 4N or more can be manufactured inexpensively.

The stibium, tellurium or selenium manufactured in accordance with the above is mixed with one or more types selected from transition metal, gallium, germanium, indium and tin as an auxiliary component with a prescribed mixing ratio, and then dissolved. It is desirable that the purity of the raw material prior to the dissolution be 99.999 wt % or more.

Upon dissolution, high purity quartz (tube or the like) is used for preventing contamination from crucible materials and inside the furnace. It is desirable that this quartz tube be formed in the shape of a plug and to make the inside of the crucible independent. With this hermetically sealed system employing the quartz tube, the compositional deviation can be significantly reduced. Dissolution is performed at a temperature higher than the melting point of the constituent element or generated compound.

As described above, by highly purifying the raw material in advance, and further reducing oxides and the amount of slag, the compositional deviation of the intended composition can be reduced. The amount of generated slag is small, and the influence is minor even if such slag is eliminated.

It is desirable to use high purity quartz in which the alkali component is 10 ppm or less and OH is 5 ppm or less. As a result, factors that affect the increase in the number of times rewriting can be conducted and realization of recording at faster speeds can be reduced as much as possible.

Thereafter, this is pulverized with the likes of a ball mill and made into powder, and this is hot pressed at a prescribed temperature to obtain a target.

EXAMPLES AND COMPARATIVE EXAMPLES

The present invention is now described with reference to the Examples and Comparative Examples. These Examples are merely illustrative, and the present invention shall in no way be limited thereby. In other words, the present invention shall only be limited by the scope of claim for a patent, and shall include the various modifications other than the Examples of this invention.

Example 1

Highly purified massive germanium, stibium and tellurium having a purity level of 5N were mixed such that the result is germanium 22.2 at %, stibium 22.2 at % and tellurium 55.6 at %, this was placed in a quartz crucible, sealed while drawing a vacuum, and dissolved at 900° C. under an Ar atmosphere.

The dissolved ingot was pulverized with a ball mill under an Ar atmosphere, the pulverized material was hot pressed, and thereafter molded into a sputtering target.

As shown in Table 1, with respect to impurities, the grand total of alkali metal and alkali earth metal was 10 ppm or less, metal element impurities other than constituent elements were 15 ppm or less, carbon component was 10 ppm or less, nitrogen component was 200 ppm or less, oxygen component was 100 ppm or less, and sulfur component was 10 ppm or less. Upon observing the texture of the bulk collected from inside the target, the average crystal grain size was 30 μm.

As a result of collecting samples from 5 locations of this target and analyzing the composition, as shown in Table 2, the compositional deviation (average value of the 5 locations) of germanium, stibium and tellurium in relation to the intended component was respectively −0.1 at %, −0.2 at % and +0.3 at %, and each of such values satisfied the conditions of the present invention.

TABLE 2

(Average Value of Samples Collected from 5 Locations)

|  | Deviation from Intended Composition |
| --- | --- |
| Germanium | −0.1 at % |
| Stibium | −0.2 at % |
| Tellurium | +0.3 at % |

Example 2

Raw materials of highly purified massive silver, indium, stibium and tellurium having a purity level of 5N were mixed such that the result is silver 5 at %, indium 5 at %, stibium 60 at % and tellurium 30 at %, this was placed in a quartz crucible, sealed while drawing a vacuum, and dissolved at 1100° C. under an Ar atmosphere.

The dissolved ingot was pulverized with a ball mill under an Ar atmosphere, the pulverized material was hot pressed, and thereafter molded into a sputtering target.

As shown in Table 1, metal elements other than constituent elements were 10 ppm or less, carbon component was 10 ppm or less, nitrogen component was 300 ppm or less, oxygen component was 300 ppm or less, and sulfur component was 10 ppm or less. Upon observing the texture of the bulk collected from inside the target, the average crystal grain size was 30 μm.

Moreover, as a result of collecting samples from 5 locations of this target and analyzing the composition, as shown in Table 3, the compositional deviation (average value of the 5 locations) of silver, indium, stibium and tellurium in relation to the intended component was respectively −0.1 at %, −0.1 at %, +0.3 at % and −0.3 at %, and each of such values satisfied the conditions of the present invention.

TABLE 3

(Average Value of Samples Collected from 5 Locations)

|  | Deviation from Intended Composition |
| --- | --- |
| Silver | −0.1 at % |
| Indium | −0.1 at % |
| Stibium | +0.3 at % |
| Tellurium | −0.3 at % |

Comparative Example 1

Highly purified massive germanium, indium, stibium and tellurium having a purity level of 5N were mixed such that the

TABLE 1

(Unit is ppm; provided U and Th are ppb)

|  | Cr | Ti | U | Th | Na | K | Fe | Ni | Cu | Ca | Mg | C | N | O | S |
| --- | --- | --- | --- | --- | --- | --- | --- | --- | --- | --- | --- | --- | --- | --- | --- |
| Example 1 | 0.1 | 3 | <0.1 | <0.1 | 1 | 2 | 0.2 | 3 | 4 | 0.2 | 0.5 | <10 | 200 | 100 | <10 |
| Example 2 | 0.1 | 2 | <0.1 | <0.1 | 1 | 2 | 0.1 | 2 | 2 | 0.1 | 0.2 | 10 | 300 | 300 | 10 |
| Comparative Example 1 | 5 | 10 | 1 | 1 | 2 | 5 | 20 | 12 | 17 | 7 | 12 | 500 | 300 | 400 | 50 | result is germanium 22.2 at %, stibium 22.2 at % and tellurium 55.5 at %, this was placed in a graphite crucible, sealed while drawing a vacuum, and dissolved at 800° C. under an Ar atmosphere.

After the dissolution, deposits of stibium and tellurium were confirmed on the wall of the furnace. The dissolved ingot was pulverized with a ball mill under an Ar atmosphere, the pulverized material was hot pressed, and thereafter molded into a sputtering target.

As shown in Table 1, with respect to impurities, metal element impurities other than constituent elements were approximately 90 ppm, carbon component was 500 ppm, nitrogen component was 300 ppm, oxygen component was 500 ppm, and sulfur component was 50 ppm. Upon observing the texture of the bulk collected from inside the target, the average crystal grain size was 60 µm.

As a result of collecting samples from 5 locations of this target and analyzing the composition, as shown in Table 4, the compositional deviation (average value of the 5 locations) of silver, germanium, stibium and tellurium in relation to the intended component was respectively +0.5 at %, +0.7 at %, −1.2 at % and −2.0 at %, and the resulting target had problems in that the compositional deviation was significant.

TABLE 4

(Average Value of Samples Collected from 5 Locations)

| | Deviation from Intended Composition |
|---|---|
| Silver | +0.5 at % |
| Germanium | +0.7 at % |
| Stibium | −1.2 at % |
| Tellurium | −2.0 at % |

The present invention yields a superior effect in that it is capable of reducing, as much as possible, impurities that cause the reduction in the number of times rewriting can be conducted as a result of such impurities segregating and condensing in the vicinity of the boundary face of the memory point and non-memory point, and in particular capable of reducing the amount impurities; for instance, gas components such as carbon, nitrogen, oxygen and sulfur, and alkali metals and alkali earth metals that diffuse and move significantly, and increasing the (crystallization) speed from an amorphous stated to a crystallized state.

Moreover, the composition deviation of the target in relation to the intended composition is made to be ±1.0 at % or less, and, as a result of reducing the segregation of the component within the target, a significant effect is yielded in that the rewriting characteristics and crystallization speed of a phase change memory can be improved.

The invention claimed is:

1. A method of manufacturing a sputtering target for use in forming a phase change memory film, comprising the steps of melting and casting a raw material in a vacuum or under a hermetically sealed inert gas atmosphere to form an ingot pulverizing the ingot to form a powder, and hot pressing the powder to form said sputtering target such that the sputtering target is composed from elements of not less than a three component system and one or more principal components selected from a group consisting of stibium, tellurium and selenium, said target has a compositional deviation in relation to an intended composition of ±1.0 at % or less, an average crystal grain size of 50 µm or less and a relative density of 90% or more; said target having a purity, excluding gas components, of 99.995 wt. % or more, and a total amount of carbon, nitrogen, oxygen and sulfur, which are gas components, of 700 ppm or less and said target has an average value of composition Ai (wt %) of respective constituent elements of said target, excluding the one or more principal components, in each of two or more samples (i =2, 3, 4 . . . ) collected from an arbitrary location within said target of A(wt %), |A−Ai|≦0.15.

2. A method according to claim 1, wherein said steps of melting and casting are performed within a hermetically sealed quartz container in which an inside thereof is a vacuum or an inert gas atmosphere.

3. A method according to claim 2, wherein said quartz container is made of high purity quartz in which alkali components are 10 ppm or less and OH components are 5 ppm or less.

4. A method according to claim 3, wherein the purity of the raw material before melting is 99.999 wt % or greater.

5. A method according to claim 4, wherein said step of melting is performed at a temperature greater Than a melting point of each constituent element or generated compound.

6. A method according to claim 1, wherein the purity of the raw material before melting is 99.999 wt % or greater.

7. A method according to claim 1, wherein said step of melting is performed at a temperature greater than a melting point of each constituent element or generated compound.

8. A method according to claim 1, wherein the raw material contains at least one auxiliary component selected from a group consisting of a transition metal, gallium, germanium, indium and tin.

9. A method of manufacturing a sputtering target for use in forming a phase change memory film, comprising the steps of:

crushing raw material of one or more principal components selected from a group consisting of stibium, tellurium and selenium;

after said crushing step, passing the raw material through a sieve to adjust grain size of the raw material to 0.5 mm to 10 mm;

after said step passing the raw material through a sieve, acid cleansing the raw material to eliminate impurities and to raise purity level of the raw material to 4N (99.99 wt %) or more;

after said step of acid cleansing, melting and casting the raw material in an inert gas atmosphere or in a vacuum by heating the raw material to a temperature greater than a melting point of each constituent component of the raw material or generated compound to form an ingot containing elements of not less than a three component system having the one or more principal components selected from a group consisting of stibium, tellurium and selenium;

pulverizing the ingot to obtain a powder; and hot pressing the powder to obtain a sputtering target that is composed from the elements of the not less than three component system including the one or more principal components selected from a group consisting of stibium, tellurium and selenium, that has a compositional deviation in relation to an intended composition of ±1.0 at % or less, an average crystal grain size of 50 µm or less and a relative density of 90% or more; said target having a purity, excluding gas components, of 99.995 wt. % or more, and a total amount of carbon, nitrogen, oxygen and sulfur, which are gas components, of 700 ppm or less and that has an average value of composition Ai (wt %) of respective constituent elements of the target, excluding the one or more principal components, in each of two or more samples (i =2, 3, 4, . . . ) collected from an arbitrary location within said target of A(wt %), |A−Ai|≦0.15.

10. A method according to claim 9, wherein said melting step includes placing the raw material in a quartz container and hermetically sealing the quartz container such that a vacuum is drawn in the sealed container or an inert gas atmosphere is provided in the sealed container, and placing the quartz container in a furnace for said heating.

11. A method according to claim 10, wherein said quartz container is made of high purity quartz in which alkali components are 10 ppm or less and OH components are 5 ppm or less.

12. A method according to claim 9, wherein the raw material used in said crushing step has a 2N (99 wt %) to 3N (99.9 wt %) purity level, and wherein the purity level of the raw material after acid cleansing and before melting is 5N (99.999 wt %) or greater.

13. A method according to claim 9, wherein the grain size of the raw material is adjusted by the sieve to 1 mm to 5 mm.

14. A method according to claim 9, wherein an acid selected from the group consisting of hydrochloric acid, sulfuric acid, nitric acid, hydrofluoric acid and mixtures thereof is used during said acid cleansing step at a concentration of 0.5N to 6N, and wherein said acid cleansing step is performed at a temperature of 10° C. to 80° C.

15. A method according to claim 14, wherein after said acid cleansing step and before said melting step, the raw material is cleansed with purified water and dried.

16. A method according to claim 9, wherein during said melting step, slag floating on the surface of the melted raw material is removed.

17. A method according to claim 9, further comprising the step of mixing at least one auxiliary component selected from the group consisting of a transition metal, gallium, germanium, indium, and tin with the raw material before said melting step.

* * * * *